United States Patent
Yoo et al.

(10) Patent No.: US 8,929,155 B2
(45) Date of Patent: Jan. 6, 2015

(54) SEMICONDUCTOR MEMORY DEVICE AND METHOD OF OPERATING THE SAME

(75) Inventors: Byoung Sung Yoo, Hwaseong-si (KR); Chang Won Yang, Icheon-si (KR)

(73) Assignee: SK Hynix Inc., Gyeonggi-do (KR)

(*) Notice: Subject to any disclaimer, the term of this patent is extended or adjusted under 35 U.S.C. 154(b) by 305 days.

(21) Appl. No.: 13/183,641

(22) Filed: Jul. 15, 2011

(65) Prior Publication Data

US 2012/0099386 A1 Apr. 26, 2012

(30) Foreign Application Priority Data

Oct. 26, 2010 (KR) .................... 10-2010-0104860

(51) Int. Cl.
*G11C 7/10* (2006.01)
*G11C 16/04* (2006.01)

(52) U.S. Cl.
CPC ........ *G11C 16/0483* (2013.01); *G11C 2216/14* (2013.01)
USPC ............... 365/189.05; 365/189.011; 365/222; 365/230.08

(58) Field of Classification Search
USPC ........................................... 365/230, 189.05
See application file for complete search history.

(56) References Cited

U.S. PATENT DOCUMENTS

| | | | | |
|---|---|---|---|---|
| 2007/0109854 A1* | 5/2007 | Shibata | ..... | 365/185.08 |
| 2007/0247928 A1* | 10/2007 | Park | ..... | 365/189.05 |
| 2007/0268748 A1* | 11/2007 | Lee et al. | ..... | 365/185.08 |
| 2007/0297228 A1* | 12/2007 | Song et al. | ..... | 365/185.08 |
| 2008/0175063 A1* | 7/2008 | Son et al. | ..... | 365/185.22 |
| 2009/0285025 A1* | 11/2009 | Ju | ..... | 365/185.12 |

FOREIGN PATENT DOCUMENTS

KR 10-0336838 B1 5/2002

* cited by examiner

*Primary Examiner* — Son Dinh
*Assistant Examiner* — Uyen B Tran
(74) *Attorney, Agent, or Firm* — William Park & Associates Patent Ltd.

(57) ABSTRACT

A semiconductor memory device includes memory cells for storing data, page buffers each configured to comprise a dynamic latch and a static latch on which data to be programmed in to the memory cells or data read from the memory cells are latched, and a control logic configured to store a plurality of refresh mode select codes corresponding to various refresh cycles, and refresh the dynamic latch by exchanging data between the static latch and the dynamic latch according to a refresh cycle corresponding to a selected refresh mode select code.

10 Claims, 6 Drawing Sheets

FIG. 5B

SEMICONDUCTOR MEMORY DEVICE AND METHOD OF OPERATING THE SAME

CROSS-REFERENCE TO RELATED APPLICATION

Priority is claimed to Korean patent application number 10-2010-0104860 filed on Oct. 26, 2010, the entirety of which is incorporated by reference.

BACKGROUND

Exemplary embodiments relate to a semiconductor memory device and a method of operating the same.

A semiconductor memory device includes a memory cell array, a row decoder, and a page buffer. The memory cell array includes a plurality of word lines extending in rows, a plurality of bit lines extending in columns, and a plurality of cell strings corresponding to the respective bit lines.

The row decoder, coupled to a string select line, word lines, and a common source line, is disposed on one side of the memory cell array. The page buffer coupled to the plurality of bit lines is disposed on the other side of the memory cell array.

In order to further improve the degree of integration of the semiconductor memory devices, active research is being done on a multi-bit cell capable of storing multiple bits in one memory cell. This type of a memory cell is called a multi-level cell (MLC). A memory cell capable of storing single bit data is called a single level cell (SLC).

In the semiconductor memory device, the page buffer senses data or stores data as required. The page buffer includes a latch circuit for latching data to be programmed into memory cells or reading data programmed into memory cells and temporarily storing the read data. The number of latches included in the page buffer is increased because the memory cell is changed into the multi-level cell.

BRIEF SUMMARY

Exemplary embodiments provide a method for maintaining data in a dynamic latch to reduce an area occupied by the page buffer of a semiconductor memory device.

A semiconductor memory device according to an aspect of the present disclosure includes memory cells for storing data, page buffers each configured to comprise a dynamic latch and a static latch on which data to be programmed in to the memory cells or data read from the memory cells are latched, and a control logic configured to store a plurality of refresh mode select codes corresponding to various refresh cycles, and refresh the dynamic latch by exchanging data between the static latch and the dynamic latch according to a refresh cycle corresponding to a selected refresh mode select code.

A method of operating a semiconductor memory device according to another aspect of the present disclosure includes providing the semiconductor memory device comprising page buffers each having a dynamic latch, selecting a refresh mode select code determined by a number of program pulses for refreshing the dynamic latch in response to an inputted refresh code, and determining whether to refresh the dynamic latch using the selected refresh mode select code and a counted number of program pulses and performing a refresh operation based on a result of the determination.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
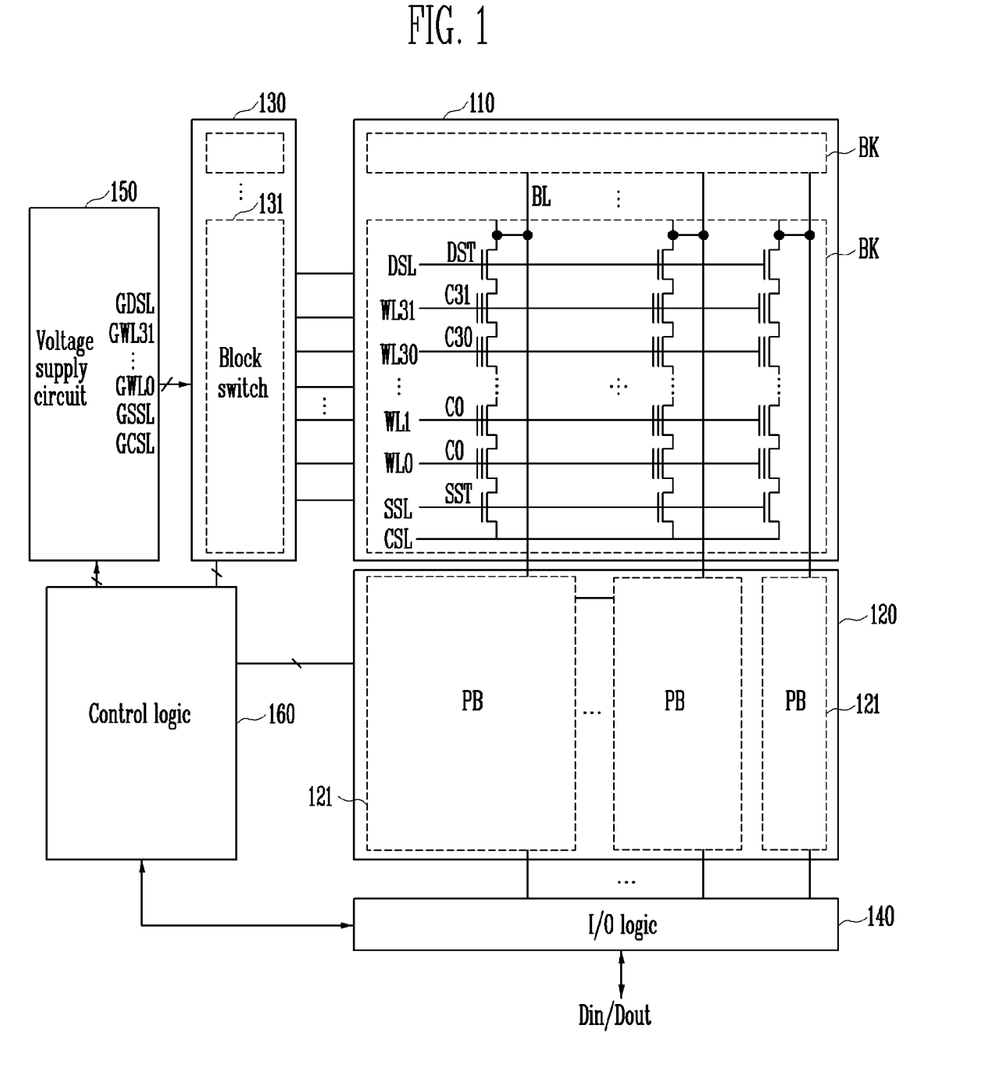
FIG. 1 shows a semiconductor memory device in accordance with an embodiment of the present disclosure.

FIG. 1 shows a semiconductor memory device in accordance with an embodiment of the present disclosure.

Referring to FIG. 1, the semiconductor memory device 100 includes a memory cell array 110, a page buffer group 120, an X decoder 130, an I/O logic 140, a voltage supply circuit 150, and a control logic 160.

The memory cell array 110 includes a plurality of memory blocks BK.

Each of the memory blocks BK includes a plurality of cell strings. Each of the cell strings has a plurality of memory cells coupled in series.

The cell string is coupled to a bit line BL.

Each of the cell strings included in the memory block BK includes $0^{th}$ to $31^{st}$ memory cells C0 to C31 coupled in series between a drain select transistor DST and a source select transistor SST. When storing data, each of the $0^{th}$ to $31^{st}$ memory cells C0 to C31 have one of four threshold voltages.

The drains of the drain select transistors DST are coupled to the respective bit lines BL.

The sources of the source select transistors SST are coupled to a common source line CSL. The gates of the drain select transistors DST are coupled to a drain select line DSL. The gates of the source select transistors SST are coupled to a source select line SSL. The gates of the $0^{th}$ to $31^{st}$ memory cells C0 to C31 are coupled to $0^{th}$ to $31^{st}$ word lines WL0 to WL31, respectively.

The page buffer group 120 includes page buffers (PB) 121 coupled to the bit lines BL of the memory cell array 110.

The page buffer 121 is coupled to one or more bit lines BL and is configured to program data into selected memory cells or to read data stored in selected memory cells.

The I/O logic 140 performs data input and output between the page buffer group 120 and an external system (not shown) coupled to the semiconductor memory device. The I/O logic 140 supplies the control logic 160 with external input commands, address information, and so on. The I/O logic 140 includes eight I/Os for external data input.

The X decoder 130 enables one of the memory blocks BK of the memory cell array 110 in response to a control signal generated by the control logic 160.

To this end, the X decoder 130 includes block switches 131 coupled to the respective memory blocks BK.

The block switch 131 enables a relevant memory block BK in response to an address signal generated by the control logic 160.

When the block switch 131 enables the memory block BK, the drain select line DSL, the source select line SSL, and the $0^{th}$ to $31^{st}$ word lines WL0 to WL31 of the memory block BK are coupled to a global drain select line GDSL, a global source select line GSSL, and $0^{th}$ to $31^{st}$ global word lines GWL0 to GWL31, respectively.

The global drain select line GDSL, the global source select line GSSL, and the $0^{th}$ to $31^{st}$ global word lines GWL0 to GWL31 are supplied with operating voltages generated by the voltage supply circuit 150.

The voltage supply circuit 150 generates the operating voltages in response to control signals generated by the control logic 160. The operating voltages include a program voltage, a read voltage, a verification voltage, an erase voltage, and so on.

The control logic 160 generates the control signals for controlling the operations of the page buffer group 120, the X decoder 130, the I/O logic 140, and the voltage supply circuit 150 in response to operation commands received via the I/O logic 140.

Each of the page buffers 121 may be coupled to one or more bit lines BL. It is assumed for ease of explanation that the page buffer 121 is coupled to one bit line BL.

Figure 2:
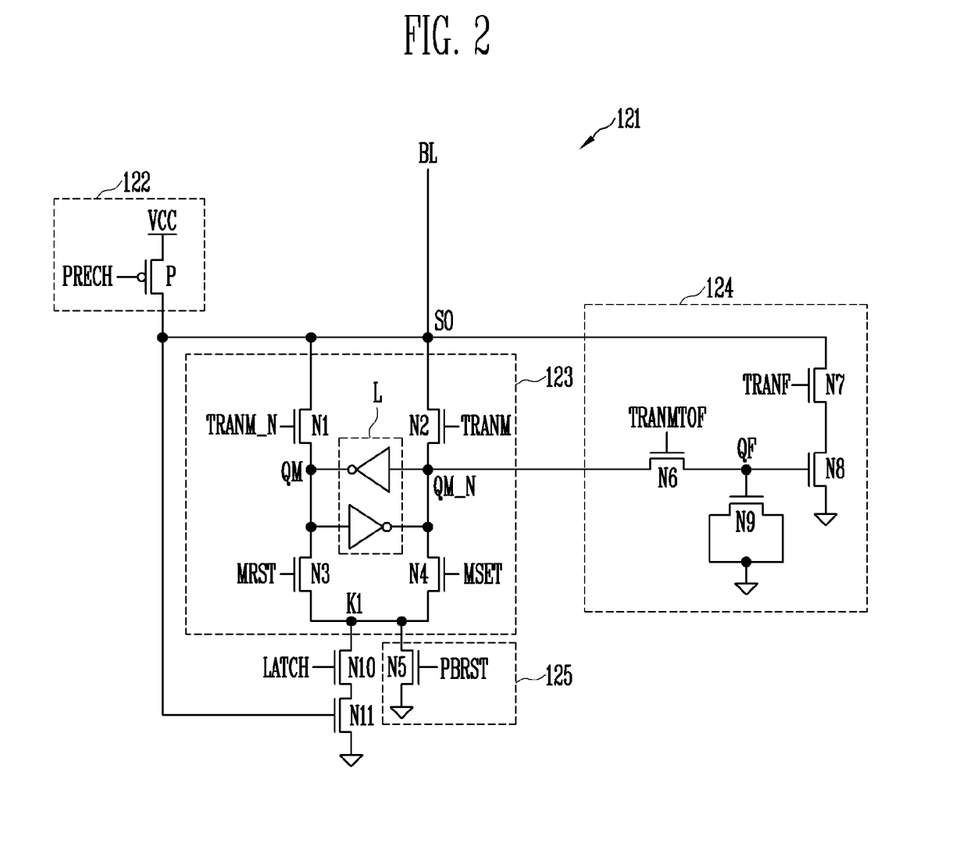
FIG. 2 shows a page buffer of FIG. 1.

FIG. 2 shows the page buffer PB of FIG. 1.

Referring to FIG. 2, the page buffer 121 includes a precharge unit 122, first and second latch unit 123 and 124, and a reset unit 125.

The precharge unit 122 includes a PMOS transistor P for precharging a sense node SO. The PMOS transistor P is coupled between the sense node SO and a terminal for a power source voltage VCC. A precharge control signal PRECH generated by the control logic 160 is inputted to the gate of the PMOS transistor P.

The sense node SO is coupled to a selected bit line BL.

The first latch unit 123 includes a static latch, and the second latch unit 124 includes a dynamic latch.

The first latch unit 123 includes first to fourth NMOS transistors N1 to N4 and the static latch L.

The first NMOS transistor N1 is coupled between the sense node SO and a node QM. A first transmission signal TRANM_N is inputted to the gate of the first NMOS transistor N1.

The second NMOS transistor N2 is coupled between the sense node SO and a node QM_N. A second transmission signal TRANM is inputted to the gate of the second NMOS transistor N2.

The first and the second transmission signals TRANM_N and TRANM are the control signals generated by the control logic 160, and they have a inverse relationship.

The static latch L includes two inverters coupled to the node QM and the node QM_N, respectively.

The third NMOS transistor N3 is coupled between the node QM and a node K1. A reset signal MRST is inputted to the gate of the third NMOS transistor N3.

The fourth NMOS transistor N4 is coupled between the node QM_N and the node K1. A set signal MSET is inputted to the gate of the fourth NMOS transistor N4.

The control logic 160 generates the reset signal MRST and the set signal MSET in order to reset and set data of the static latch L.

The second latch unit 124 includes sixth to ninth NMOS transistors N6 to N9.

The sixth NMOS transistor N6 is coupled between the node QM_N and a node QF. A third transmission signal TRANMTOF is inputted to the gate of the sixth NMOS transistor N6.

The control logic 160 generates the third transmission signal TRANMTOF to enable the first latch unit 123 to send data to the second latch unit 124.

The seventh and the eighth NMOS transistors N7 and N8 are coupled in series between the sense node SO and a ground node. A fourth transmission signal TRANF is inputted to the gate of the seventh NMOS transistor N7. The gate of the eighth NMOS transistor N8 is coupled to the node QF.

The role of the dynamic latch is performed based on the capacitance characteristics of the eighth NMOS transistor N8. In order to supplement the capacitance of the eighth NMOS transistor N8, the ninth NMOS transistor N9 is coupled between the node QF and the ground node in the form of a capacitor.

The fourth transmission signal TRANF is generated by the control logic 160.

The reset unit 125 includes a fifth NMOS transistor N5 for resetting data of the first latch unit 123.

The fifth NMOS transistor N5 is coupled between the node K1 and the ground node. A page buffer reset signal PBRST is inputted to the gate of the fifth NMOS transistor N5. The control logic 160 generates the page buffer reset signal PBRST in order to reset data of the first latch unit 123.

The page buffer 121 further includes tenth and eleventh NMOS transistors N10 and N11 for changing data of the first latch unit 123 in response to voltage of the sense node SO.

The tenth and the eleventh NMOS transistors N10 and N11 are coupled in series between the node K1 and the ground node. A latch signal LATCH is inputted to the gate of the tenth NMOS transistor N10. The gate of the eleventh NMOS transistor N11 is coupled to the sense node SO.

The page buffer 121 may include larger latches coupled to the sense node SO.

The dynamic latch of the second latch unit 124 is useful to reducing the area of the page buffer 121 because it has fewer elements than the static latch of the first latch unit 123.

However, when leakage current is generated, data stored in a dynamic latch may be changed because the data of the dynamic latch is stored using capacitance of the eighth NMOS transistor N8 and the ninth NMOS transistor N9. Accordingly, it is necessary to retain the data of the dynamic latch by periodically performing a refresh operation.

The control logic 160 of the semiconductor memory device 100 according to an exemplary embodiment of this disclosure stores refresh mode select codes regarding when the refresh operation will be performed in an internal register (not shown) or an additional storage unit (not shown).

Table 1 shows an example of the refresh mode select codes that may be stored in the control logic 160.

TABLE 1

| REFRESH MODE SELECT CODE | NOTE |
| --- | --- |
| 0000 | No refresh |
| 0001 | Refresh for each program pulse |
| 0010 | Refresh for two program pulses |
| 0011 | Refresh for four program pulses |
| 0100 | Refresh for eighth program pulses |
| 0101 | Refresh for sixteen program pulses |

When a refresh code indicating when the refresh operation will be performed is externally inputted, the refresh mode select code is determined, and the second latch unit 124 is refreshed during a program operation.

The externally inputted refresh code is the same as the refresh mode select code.

An embodiment of this disclosure provides a method of refreshing the dynamic latch for storing program data in the second latch unit 124.

Figure 3:
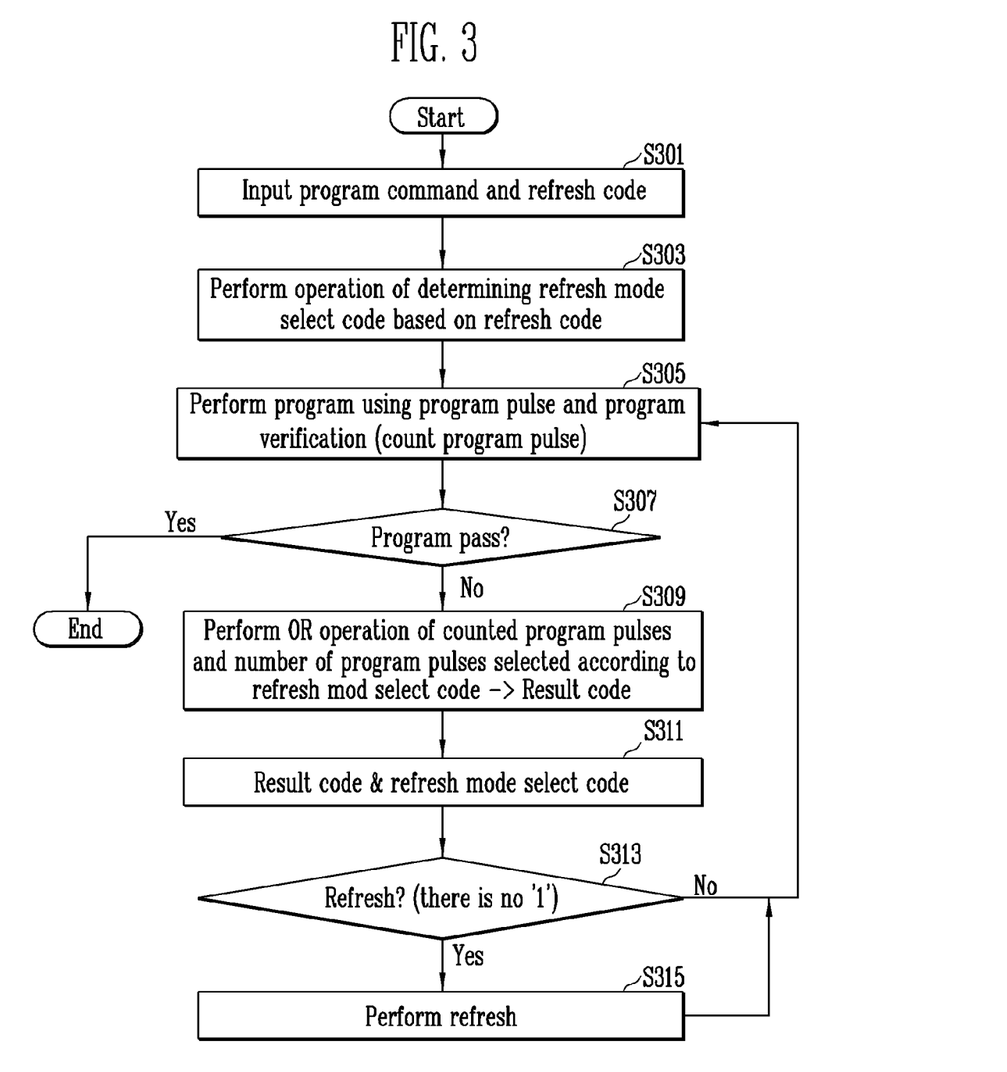
FIG. 3 is a flowchart illustrating a dynamic latch refresh operation according to an exemplary embodiment of this disclosure.

FIG. 3 is a flowchart illustrating a dynamic latch refresh operation according to an exemplary embodiment of this disclosure.

FIG. 3 shows an operation sequence for refreshing the dynamic latch of the second latch unit 124 in response to a program pulse supplied while a program cycle is performed in the semiconductor memory device. The flowchart of FIG. 3 will be described with reference to FIGS. 1 and 2.

Referring to FIG. 3, a refresh code, together with a program command, is inputted externally at step S301. The refresh code may be inputted for each program command or may be inputted when the semiconductor memory device is initially driven.

When the refresh code is inputted, the control logic 160 has to determine when to perform a refresh operation while a program cycle is performed.

To this end, the control logic 160 first performs an operation of determining a refresh mode select code based on the refresh code at step S303.

The operation of determining the refresh mode select code includes an AND operation of the refresh code and a set code.

The set code is used to match the refresh code with the refresh mode select code.

The I/O logic 140 of the semiconductor memory device 100 according to an exemplary embodiment of this disclosure includes the eight I/Os. Accordingly, the refresh code has 8 bits, but only the lower 4 bits is actually used as refresh code.

The upper 4 bits are set to '0' by being ANDed with a mask '00001111', so that only the remaining lower 4 bits may be preserved.

The control logic 160 selects a refresh mode select code corresponding to the 4-bit refresh code, from among the refresh mode select codes of Table 1. In this example, the 4-bit refresh code '0011' may be the same as the refresh mode select code '0011' that indicates a refresh pulse every four program cycles.

When the refresh mode select code is '0011', the second latch unit 124 is refreshed whenever four program pulses are inputted according to Table 1.

After the refresh mode select code is determined, a program pulse is supplied and program and verification operations are performed at step S305, as in a common program operation.

The control logic 160 may count the number of program pulses. The program pulse is counted in the form of an eight bit binary number. When a first program pulse is supplied, count of the number of program pulses becomes '00000001' and the count increments for each additional program pulse.

After the program and verification operations are performed, the control logic 160 determines whether the program verification operation is a pass at step S307. If the program verification operation is determined to be a pass, the program operation is terminated.

If, however, the program verification operation is determined not to be a pass, the control logic 160 generates a result code at step S309. The result code is generated by performing an OR operation of the number of program pulses counted so far and the number of program pulses selected according to the refresh mode select code.

The refresh mode select code of '0011' indicates that the second latch unit 124 has to be refreshed after four program pulses. Accordingly, the control logic 160 performs an OR operation of the number of program pulses counted so far, and '00000100' indicating the four program pulses before a refresh operation to generate a result code.

If the number of counted program pulses so far is three, '00000011' is ORed with '00000100' (indicating the desired four program pulses), to produce the result code of '00000111'.

At step S311, the control logic 160 performs an AND operation of the result code '00000111' from step S309 and '00000011', the refresh mode select code '0011'. A result of the AND operation is a final code '00000011'.

After the AND operation is completed, the control logic 160 determines whether any of the bits in the final code is a '1' at step S313.

If, as a result of the determination, a '1' is determined to exist in the final code, the control logic 160 does not perform a refresh operation and performs program and verification operations by supplying the program pulse again at step S305. In this case, since the final code is '0011' the next step is step S305 without a refresh.

If, as a result of the determination, data '1' is determined not to exist in the final code, however, the control logic 160 performs the refresh operation at step S315. The operation of refreshing the second latch unit 124 will be described in detail later.

If the four program pulses are supplied, the number of counted program pulses becomes '00000100'. When an OR operation of '00000100' and '00000100' is performed at step S309, a result code becomes '00000100'.

When an AND operation of the result code and the refresh mode select code is performed, it results in '00000000'. That is, data '1' does not exist in the final code. Accordingly, a refresh operation is performed.

Likewise, if six program pulses are supplied, a result code becomes '00000110' through an OR operation of '00000110' and '00000100'.

When an AND operation of the result code and the refresh mode select code is performed, it results in '00000010'. Accordingly, a refresh operation is not performed because data '1' exists in the final code.

If eight program pulses are supplied, a result code become '00001100' through an OR operation of '00001000' and '00000100'.

When an AND operation of the result code and the refresh mode select code is performed, it results in '00000000'. Accordingly, a refresh operation is performed.

As described above, when an external refresh code is inputted, the number of program pulses for performing a refresh operation is selected. Accordingly, a user can perform a refresh operation when he wants the refresh operation.

The refresh operation may be performed as follows.

Figure 4:
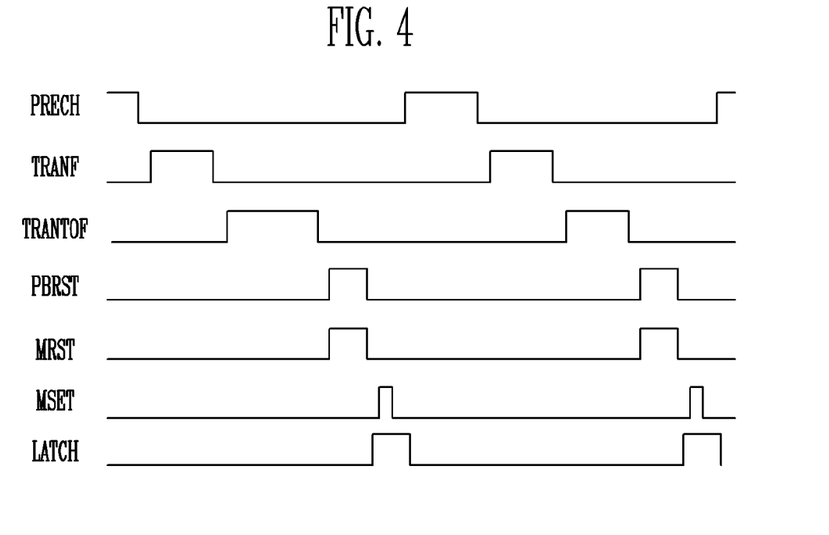
FIG. 4 is a timing diagram illustrating the refresh operation of a second latch unit shown in FIG. 2.

FIG. 4 is a timing diagram illustrating the refresh operation of the second latch unit shown in FIG. 2.

Table 2 shows data states of the nodes of the first and the second latch units 122 and 123 when the refresh operation is performed.

TABLE 2

|  | SO | QM_N | QF |
|---|---|---|---|
|  | — | 1100 | 0101 |
| TRANF | 1010 | 1100 | 0101 |
| TRANMTOF | 1010 | 1100 | 1100 |
| PBRST, MRST | 1010 | 1111 | 1100 |
| MSET | 1010 | 0101 | 1100 |
| TRANF | 0011 | 0101 | 1100 |
| TRANMTOF | 0011 | 0101 | 0101 |
| PBRST, MRST | 0011 | 1111 | 0101 |
| MSET | 0011 | 1100 | 0101 |

Table 2 shows the four data states that can be stored in the first and the second latch units 123 and 124. That is, the reason why the data state of the node QM_N is '1100' and the data state of the node QF is '0101' is to describe all cases in each of which data of 2 bits stored in each of the first and the second latch units 122 and 123 is '10', '11', '00', or '01'.

Even though the dynamic latch of the second latch unit 124 is refreshed, data stored in the first latch unit 123 and data stored in the second latch unit 124 have to maintain their original states.

Referring to FIG. 4 and Table 2, first, the control logic 160 changes the precharge control signal PRECH of a high level into the precharge control signal PRECH of a low level.

In response, data of the sense node SO is precharged to '1'.

When the control logic 160 inputs the fourth transmission signal TRANF of a high level, the seventh NMOS transistor N7 is turned on, and a data state of the sense node SO becomes '1010' according to data of the node QF.

For example, when data of the node QF is '1', the eighth NMOS transistor N8 is turned on. Accordingly, the sense node SO is coupled to the ground node, and so data of the sense node SO becomes '0'.

When data of the node QF is '0', the eighth NMOS transistor N8 is turned off, and thus the data of the sense node SO remains a '1'.

The control logic 160 changes the fourth transmission signal TRANF of a high level to a low level and then inputs the third transmission signal TRANMTOF of a high level. In response, the sixth NMOS transistor N6 is turned on, and data of the node QM_N is transferred to the node QF.

The node QF initially had the data state '0101', and the node QM_N initially had the data state '1100'. Accordingly, the data state of the node QF is changed into '1100'.

Next, the control logic 160 resets the static latch L of the first latch unit 123. To this end, the control logic 160 supplies the page buffer reset signal PBRST of a high level and the reset signal MRST of a high level. At this time, the high level of the third transmission signal TRANMTOF is changed into a low level.

When the page buffer reset signal PBRST of a high level and the reset signal MRST of a high level are supplied, the fifth and the third NMOS transistors N5 and N3 are turned on, and data of the node QM becomes '0'. Accordingly, the data state of the node QM_N is reset to '1111'.

After the first latch unit 123 is reset, data of the static latch L is changed according to a data state of the sense node SO. To this end, the control logic 160 supplies the latch signal LATCH of a high level and the reset signal MSET of a high level.

Accordingly, since the data sate of the sense node SO is '1010', the data state of the node QM_N becomes '0101'.

For example, when data of the sense node SO is '1', the eleventh NMOS transistor N11 is turned on. The tenth NMOS transistor N10 is also turned on in response to the latch signal LATCH of a high level. Accordingly, the node K1 is coupled to the ground node.

Furthermore, data of the node QM_N becomes '0' because the fourth NMOS transistor N4 is turned on in response to the set signal MSET of a high level.

When data of the sense node SO is '0', the data of the node QM_N is not changed because the eleventh NMOS transistor N11 remains turned off.

The first latch unit 123 and the second latch unit 124 are changed by the above operation.

When the above operation is repeated, data of the first latch unit 123 and data of the second latch unit 124 are changed again. That is, data of the first latch unit 123 and data of the second latch unit 124 are restored to their original states. The dynamic latch of the second latch unit 124 is refreshed by the above operation.

Figure 5A:
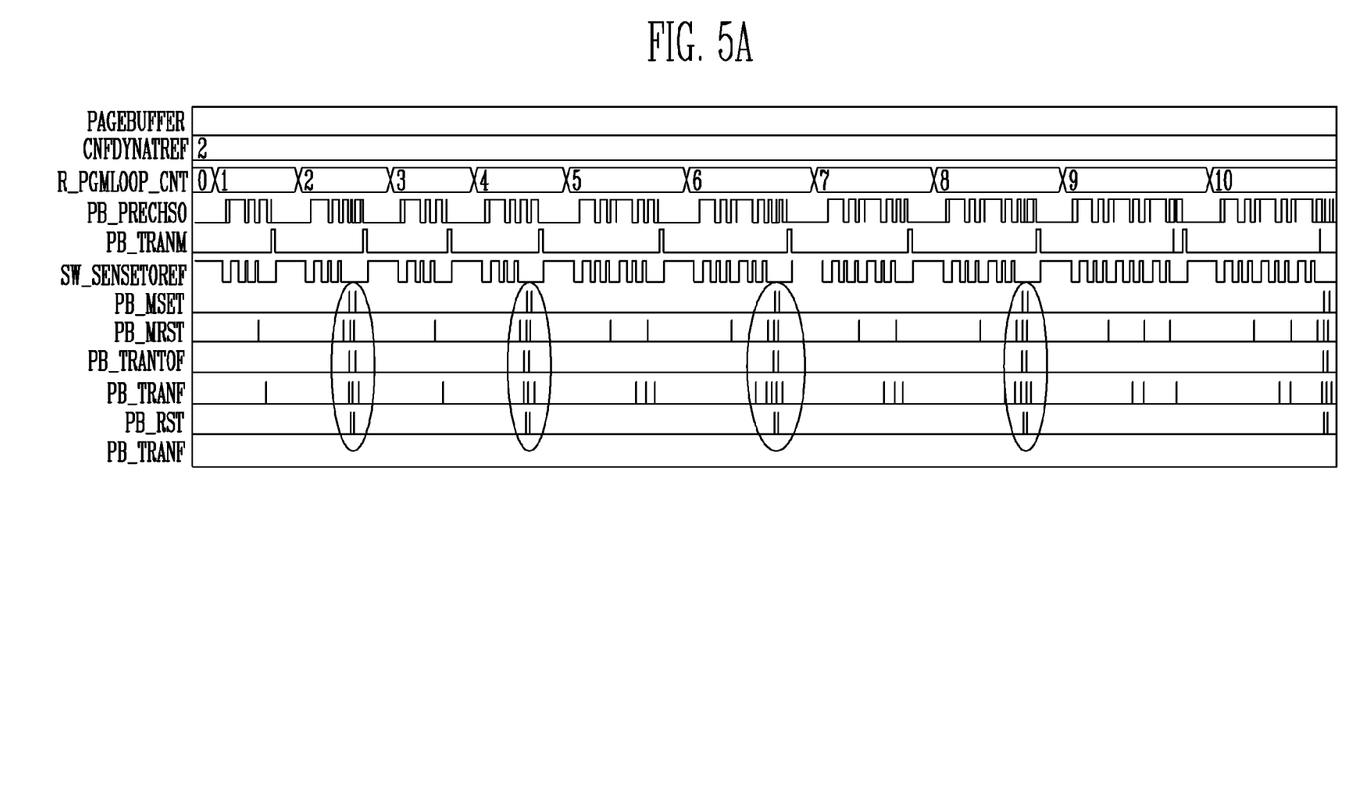
FIGS. 5A and 5B show simulation results of a program operation while using the refresh method according to an exemplary embodiment of this disclosure.
Figure 5B:
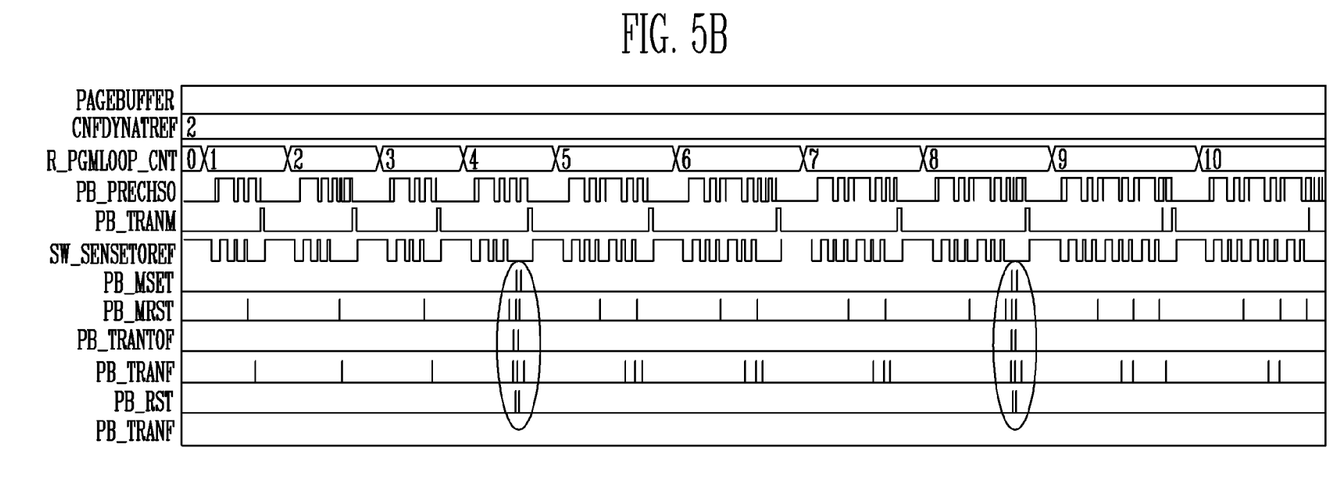

FIGS. 5A and 5B show results of a program operation simulated while using the refresh method according to an exemplary embodiment of this disclosure.

FIG. 5A shows a refresh operation performed whenever two program pulses are supplied and FIG. 5B shows a refresh operation performed whenever four program pulses are supplied.

Circles shown in FIGS. 5A and 5B indicate the control signals while the refresh operations are performed.

The time when an operation of refreshing the dynamic latch is performed can be determined by the above refresh method. If it is sought to reduce the program operation time, the number of refresh operations can be reduced. For example, a refresh code may be inputted such that a refresh operation is performed once for eight program pulses. To improve reliability of data even though the program operation time is increased, a refresh code may be inputted such that a refresh operation is performed for each program pulse.

As described above, since the dynamic latch is included in the page buffer 121, the area for the latch circuitry can be reduced, and a user can determine the refresh time according to his purposes.

According to the semiconductor memory device and the method of operating the same according to some exemplary embodiments of this disclosure, when a program is performed using the page buffer including the dynamic latch, a refresh operation for maintaining data of the dynamic latch can be performed in various ways according to a program pulse.

What is claimed is:

1. A semiconductor memory device, comprising:
memory cells for storing data;
page buffers each configured to comprise a dynamic latch and a static latch on which data to be programmed in to the memory cells or data read from the memory cells are latched; and
a control logic configured to store a plurality of refresh mode select codes corresponding to a plurality of supplied numbers of program pulses, respectively,
wherein the data is programmed into the memory cells by supplying program pulses to the memory cells in response to a program command,
wherein the control logic is configured to select a refresh mode select code from the plurality of refresh mode select codes based on a refresh code from an external device of the semiconductor memory device, the refresh code being received together with the program command, and
wherein the control logic is configured to refresh the dynamic latch by exchanging data between the static latch and the dynamic latch whenever program pulses are supplied a predetermined number of times according to the selected refresh mode select code.

2. The semiconductor memory device of claim 1, wherein the control logic performs an AND operation of a inputted refresh code and a mask, and selects the selected refresh mode select code based on a result of the AND operation.

3. The semiconductor memory device of claim 2, wherein the control logic generates a result code by performing an OR operation of a counted number of program pulses and the selected refresh mode select code.

4. The semiconductor memory device of claim 3, wherein the control logic generates a final code by performing an AND operation of the result code and the selected refresh mode select code, wherein each of the page buffers refreshes its dynamic latch when there is no data '1' in the final code.

5. A method of operating a semiconductor memory device, the method comprising:
- providing the semiconductor memory device comprising page buffers each having a dynamic latch;
- selecting a refresh mode select code corresponding to a number of program pulses for refreshing the dynamic latch in response to an refresh code from the external device of the semiconductor memory device, the refresh code is received together with a program command;
- determining whether to refresh the dynamic latch using the selected refresh mode select code and a counted number of program pulses which is supplied in response to the program command; and
- performing a refresh operation whenever program pulses are supplied a predetermined number of times according to the selected refresh mode select code.

6. The method of claim 5, wherein the refresh mode select code comprises:
- a first refresh mode select code for periodically performing the refresh operation whenever the program pulse is supplied,
- a second refresh mode select code for performing the refresh operation whenever k, an integer, program pulses are supplied, and
- a third refresh select mode code for performing the refresh operation whenever j, an integer, program pulses are supplied.

7. The method of claim 6, wherein each of the k and the j is a multiple of 2.

8. The method of claim 5, wherein selecting the refresh mode select code comprises performing an AND operation of the refresh code and a mask and selecting the refresh mode select code according to a result of the AND operation.

9. The method of claim 8, wherein determining whether to refresh the dynamic latch comprises:
- generating a result code by performing an OR operation of the number of counted program pulses and the selected refresh mode select code;
- generating a final code by performing an AND operation of the result code and the selected refresh mode select code; and
- performing the refresh operation when there is no bit in the final code is a '1'.

10. The method of claim 5, wherein performing the refresh operation comprises exchanging data of the static latch and its corresponding dynamic latch in the page buffer, and again exchanging the data of the static latch and its dynamic latch.

* * * * *